United States Patent
Angyal et al.

(10) Patent No.: US 7,475,368 B2
(45) Date of Patent: Jan. 6, 2009

(54) DEFLECTION ANALYSIS SYSTEM AND METHOD FOR CIRCUIT DESIGN

(75) Inventors: Matthew S. Angyal, Stormville, NY (US); Giovanni Fiorenza, Pomona, NY (US); Habib Hichri, Poughkeepsie, NY (US); Andrew Lu, Poughkeepsie, NY (US); Dale C. McHerron, Staatsburg, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 11/336,524

(22) Filed: Jan. 20, 2006

(65) Prior Publication Data

US 2007/0174796 A1    Jul. 26, 2007

(51) Int. Cl.
    G06F 17/50    (2006.01)
(52) U.S. Cl. .................. 716/4; 716/5; 716/6; 438/626; 438/690; 438/691; 438/692
(58) Field of Classification Search .................. 716/4–6; 438/626, 690–692
    See application file for complete search history.

(56) References Cited

U.S. PATENT DOCUMENTS

| | | | | |
|---|---|---|---|---|
| 5,919,493 A * | 7/1999 | Sheppard et al. | ......... | 425/174.2 |
| 6,057,068 A * | 5/2000 | Raeder et al. | ................. | 430/30 |
| 6,091,131 A * | 7/2000 | Cook et al. | ................. | 257/629 |
| 6,130,015 A * | 10/2000 | Noddin et al. | ................ | 430/22 |
| 6,143,401 A * | 11/2000 | Fischer et al. | ............ | 428/322.7 |
| 6,396,158 B1 * | 5/2002 | Travis et al. | ................. | 257/784 |
| 6,403,462 B1 * | 6/2002 | Hasunuma et al. | .......... | 438/622 |
| 6,551,933 B1 * | 4/2003 | Molnar | ....................... | 438/690 |
| 6,667,239 B2 * | 12/2003 | Saka et al. | ................... | 438/692 |
| 6,713,873 B1 * | 3/2004 | O'Loughlin et al. | ........ | 257/758 |
| 6,961,626 B1 * | 11/2005 | Paik | ........................... | 700/31 |
| 6,986,698 B1 * | 1/2006 | Molnar | ........................ | 451/5 |
| 7,008,300 B1 * | 3/2006 | Molnar | ....................... | 451/41 |
| 7,186,613 B2 * | 3/2007 | Kirner et al. | ................ | 438/240 |
| 7,260,810 B2 * | 8/2007 | Filippi et al. | .................. | 716/20 |
| 2003/0104649 A1 * | 6/2003 | Ozgur et al. | .................. | 438/50 |
| 2005/0086628 A1 | 4/2005 | Filippi, Jr. et al. | | |
| 2006/0067651 A1 * | 3/2006 | Chui | ........................... | 385/147 |
| 2006/0103017 A1 * | 5/2006 | Usui et al. | ................... | 257/725 |
| 2006/0276977 A1 * | 12/2006 | Rosakis et al. | ................ | 702/42 |

OTHER PUBLICATIONS

Ouma et al. "Characterization and modeling of oxide chemical-mechanical polishing using planarization length and pattern density concepts ", Semiconductor Manufacturing, IEEE Transactions on vol. 15, Issue 2, May 2002 pp. 232-244.*

* cited by examiner

*Primary Examiner*—Thuan Do
*Assistant Examiner*—Naum B Levin
(74) *Attorney, Agent, or Firm*—Scully, Scott, Murphy & Presser, P.C.; Todd M. C. Li, Esq.

(57) ABSTRACT

A system, a method and a computer program product for analyzing a circuit design provide for discretizing the circuit design into a series of pixels. A fraction of at least one constituent material is determined for each pixel. A deflection is also determined for each pixel. The deflection is predicated upon a planarizing of the pixel, and it is calculated while utilizing an algorithm that includes the fraction of the at least one constituent material. A series of deflections for the series of pixels may be mapped and evaluated.

9 Claims, 4 Drawing Sheets

DEFLECTION ANALYSIS SYSTEM AND METHOD FOR CIRCUIT DESIGN

BACKGROUND

1. Field of the Invention

The invention relates generally to circuit design. More particularly, the invention relates to computer assisted simulation within circuit design.

2. Description of the Related Art

In order to provide for enhanced performance, modern semiconductor circuits utilize metallization structures that typically comprise copper containing conductor layers. The metallization structures also typically comprise generally lower dielectric constant dielectric layers (i.e., low-k, having a dielectric constant less than about 4.0 and typically from about 2.0 to about 4.0) surrounding the copper containing conductor layers. Copper containing materials provide for enhanced conductivity, while the low dielectric constant dielectric materials provide for enhanced speed and inhibited detrimental capacitive effects such as cross-talk. Since many lower dielectric constant dielectric materials are incompatible with copper containing conductor materials, the metallization structures also typically comprise denser and impervious dielectric barrier layers and conductor barrier layers interposed between the copper containing conductor layers and the low dielectric constant dielectric layers.

Metallization schemes within modern integrated circuits often include up to 10-12 metallization levels. Metallization processing typically involves a damascene or a dual damascene method that is intended to preserve planarity while processing. Damascene methods provide for forming a dielectric layer over a substrate. Appropriate vias and trenches are etched into the dielectric layer and they are overfilled with a metallization layer deposited therein. Excess metal is removed utilizing a planarization method.

Given the increased number of metallization layers in modern integrated circuits, topographic variations are common notwithstanding use of planarizing methods. Similarly, as the dimensions of the semiconductor structures within existing and future generations of semiconductor circuits decreases, the tolerances on the photolithography processes used to pattern the features become smaller. The depth of focus associated with the equipment that patterns features on a photosensitive film limits the magnitude of the variation in height or planarity across a semiconductor substrate. If the topography or height variation exceeds this tolerance, then certain patterns across the wafer will be out of focus, leading to errors in the dimensions of the final structures. The errors can be additive, leading to larger topography differences as the number of levels fabricated on a substrate increases.

Methods for analyzing metallization structures (i.e., post silicon processing back end of line (BEOL) structures) within semiconductor chips are known in the art. For example, Filippi, Jr., et al., in U.S. Pub. No. 2005/0086628 A1 teaches a circuit design analysis system and method that includes discretizing a circuit design into a series of pixel elements (i.e., pixels) for further analysis.

Semiconductor structure dimensions will likely continue to decrease, and as a result thereof semiconductor photolithography requirements are thus likely to have more stringent depth-of-focus requirements. Thus, desirable within semiconductor fabrication are additional systems and methods that may be utilized to assist in assuring that semiconductor photolithography processing may be undertaken within expected depth of focus requirements.

SUMMARY OF THE INVENTION

The invention provides a system, a method and a program product for analyzing a circuit design. The system, the method and the program product provide circuit design analysis results within the context of a series of pixel deflections resulting from planarizing a series of pixels discretized from the circuit design. The system and the method are generally applicable to a circuit design whose physical implementation involves a planarizing process.

The system, the method and the program product utilize an algorithm that considers fractions of constituent materials within individual pixels discretized from the circuit design. Typically the materials include, but are not limited to: at least one conductor material and at least one dielectric material.

More particularly with respect to an inventive computer system for analyzing a circuit design, the computer system includes a means for discretizing a circuit design into a series of pixel elements. It also includes a means for determining for each pixel element a fraction of at least one constituent material. Finally, it also includes a means for determining for each pixel element a deflection predicated upon a planarizing of the pixel element while utilizing an algorithm that includes the fraction of the at least one constituent material.

As an additional element, the computer system may also include a means for mapping the deflection for each pixel element. As another additional element, the computer system may also include a means for evaluating the map.

The inventive system is applicable to semiconductor circuit designs as well as non-semiconductor circuit designs. The system is intended as applicable for one or both of a copper material and a low dielectric constant dielectric material as constituent materials within a circuit design.

For a circuit design comprising (primarily), consisting essentially of or consisting of a copper constituent material and a dielectric constituent material, the algorithm utilized within the system may be:

$$\delta = \frac{P}{A} \sum_i \left[ \frac{h_i}{x^i_{Cu} E_{Cu} + (1 - x^i_{Cu}) E_{diel}} \right]$$

where: $\delta$=deflection;
P=planarizing downforce;
A=pixel area;
$h_i$=height of the $i^{th}$ wiring level;
$x^i_{Cu}$=area fraction of the copper constituent material in the $i^{th}$ wiring level;
$E_{Cu}$=Young's modulus of the copper constituent material; and
$E_{diel}$=Young's modulus of the dielectric constituent material.

For circuit designs comprising additional constituent materials, or conductor constituent materials in the alternative of copper conductor constituent materials (for example and without limitation aluminum conductor constituent materials), a more general example of a planarizing deflection algorithm utilized within the system is:

$$\delta = \frac{P}{A} \sum_i \left[ \frac{h_i}{\sum_j x^i_j E^i_j} \right]$$

where: δ=deflection;
P=planarizing downforce;
A=pixel area;
$h_i$=height of the $i^{th}$ wiring level;
$x^i_j$=area fraction of the $j^{th}$ constituent material in the $i^{th}$ wiring level; and
$E^i_j$=Young's modulus of the $j^{th}$ constituent material in the $i^{th}$ wiring level.

The method of the invention and the computer program product of the invention derive from the system of the invention. They also have the same additional limitations.

In particular, an inventive method for analyzing a circuit design includes discretizing the circuit design into a series of pixel elements. It also includes determining for each pixel element a fraction of at least one constituent material. Finally, it includes determining for each pixel element a deflection predicated upon a planarizing of the pixel element while utilizing an algorithm that includes the fraction of the at least one constituent material.

A first additional element of the method includes mapping the deflection for each pixel element. A second additional element includes evaluating the map.

Also in particular, the inventive computer program product includes a computer useable medium including a computer readable program. The computer readable program when executed on a computer causes the computer to discretize a circuit design into a series of pixels. It also causes the computer to determine for each pixel a fraction of at least one constituent material. Finally, it also causes the computer to determine for each pixel a deflection predicated upon a planarizing of the pixel element while utilizing an algorithm that includes the fraction of the at least one constituent material.

A first additional element of the computer program product causes the computer to map the deflection for each pixel. A second additional element of the computer readable program causes the computer to evaluate the map.

BRIEF DESCRIPTION OF THE DRAWINGS

The features of the invention believed to be novel and the elements characteristic of the invention are set forth with particularity in the appended claims. The figures are for illustration purposes only. The invention itself, however, both as to organization and method of operation, may best be understood by reference to the detailed description which follows, taken in conjunction with the accompanying drawings in which:

DESCRIPTION OF THE PREFERRED EMBODIMENT

The invention provides a system, a method and a computer program product for analyzing a circuit design. The system, the method and the program product provide circuit analysis results within the context of a deflection resulting from planarizing discretized pixels within the circuit design.

Figure 1:
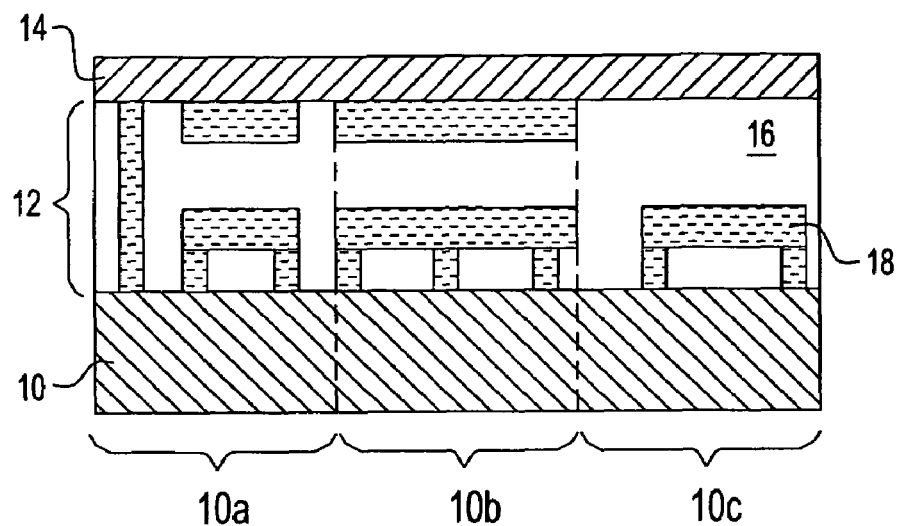
FIG. 1 shows a schematic cross-sectional diagram of a circuit design.

FIG. 1 shows a schematic cross-sectional diagram of a circuit design whose discretized pixels deflections may be determined and mapped in accordance with an embodiment of the invention.

FIG. 1 shows a substrate 10 that comprises three pixels (i.e., pixel regions) 10a, 10b and 10c. Within the instant embodiment, the substrate 10 may comprise one or more of a conductor material, a semiconductor material and a dielectric material. The substrate 10 may include, but is not limited to: a semiconductor substrate, a ceramic substrate, a resinous-glass composite substrate and a flat panel display substrate. With respect to any of the foregoing substrates, the embodiment and the invention also contemplate that the substrate 10 may have electrical devices or semiconductor devices located therein, thereon or thereupon. The presence of electrical devices or semiconductor devices is not required within the invention, but is nonetheless typical when the substrate 10 comprises any of the above substrates. Typical electrical or semiconductor devices include, but are not limited to: transistors, resistors, diodes and capacitors.

FIG. 1 also shows a multilayer metallization layer 12 located upon the substrate 10, including the pixels 10a, 10b and 10c. The multilayer metallization layer 12 comprises a series of conductor layers 18. A series of dielectric layers 16 is located interposed between the series of conductor layers 18. The conductor layers 18 have one or both of vertically extending components and horizontally extending components. Vertically extending components are typically stud layers that are located within vias within the dielectric layers 16. Horizontally extending components are typically interconnect layers that are located within trenches within the dielectric layers 16.

The embodiment and the invention contemplate that both the conductor layers 18 and the dielectric layers 16 may comprise, respectively, any of several conductor materials and dielectric materials. Non-limiting examples of conductor materials include metal, metal alloy, metal nitride, metal silicide, doped polysilicon (i.e., 1e18 to 1e22 dopant atoms per cubic centimeter) and polycide conductor materials. Non-limiting examples of dielectric materials include: (1) silicon oxide, silicon nitride, silicon oxynitride materials that have moderate dielectric constants in a range from about 4 to about 20; as well as (2) lower dielectric constant dielectric materials having a dielectric constant less than about 4, and more typically from about 2 to about 4. Non-limiting examples of low dielectric constant dielectric materials include aerogels, hydrogels, some doped silicate glasses (i.e., carbon, boron, fluorine and/or phosphorus), silsesquioxane spin-on-glass (SOG), other spin-on-glasses, organic polymers and fluorinated organic polymers.

Most typically within the instant embodiment: (1) the substrate 10 comprises a semiconductor substrate having semiconductor devices located thereupon; (2) the conductor layers 18 comprise a copper containing conductor material along with appropriate conductor barrier materials; and (3) the dielectric layers 16 comprise a low dielectric constant dielectric material along with appropriate dielectric barrier materials. The embodiment also contemplates that conductor materials and dielectric materials utilized within conductor layers 18 and dielectric layers 16 will often have differing mechanical properties. In particular, copper conductor materials will typically have a Young's modulus from about 120 to about 140 gigapascals (GPa), while low dielectric constant dielectric materials will typically have a Young's modulus from about 10 to about 20 GPa.

FIG. 1 finally shows a passivation layer 14 located upon the multilayer metallization layer 12. As is indicated below, the passivation layer 14 may be optional within certain embodiments of the invention. The passivation layer 14 comprises a passivation material, typically although not necessarily exclusively a dielectric passivation material. Non-limiting examples of dielectric passivation materials include nitrides and oxynitrides such as silicon nitrides and silicon oxynitrides, as well as organic polymer passivation materials (of which polyimide passivation materials are a non-limiting example). Other dielectric passivation materials may alternatively be utilized.

The embodiment also contemplates that the substrate 10, each of the conductor layers 18 and dielectric layers 16 within the multilayer metallization layer 12 and the passivation layer 14 (which is optional within certain examples of circuit designs) has a particular measured or designed thickness. Typical thicknesses will vary depending upon the nature and intended use of the circuit design whose cross-sectional diagram is illustrated in FIG. 1. Semiconductor circuit designs will typically have layer thicknesses ranging from about 10 to about 2000 angstroms. Other circuit designs will typically have layer thickness at least two to three orders of magnitude greater. As is also noted below, a circuit design deflection analysis in accordance with the invention may be performed at any of several progressive physical locations within the multi-layer metallization layer 12 when progressively fabricating the multi-layer metallization layer 12. Thus, such a deflection analysis in accordance with the invention is not limited to the structure of FIG. 1 either with or without the passivation layer 14. Rather, the invention also contemplates applicability to a structure correlating to the structure of FIG. 1, but absent the passivation layer 14 and with a partially completed multi-layer metallization layer 12.

Figure 2:
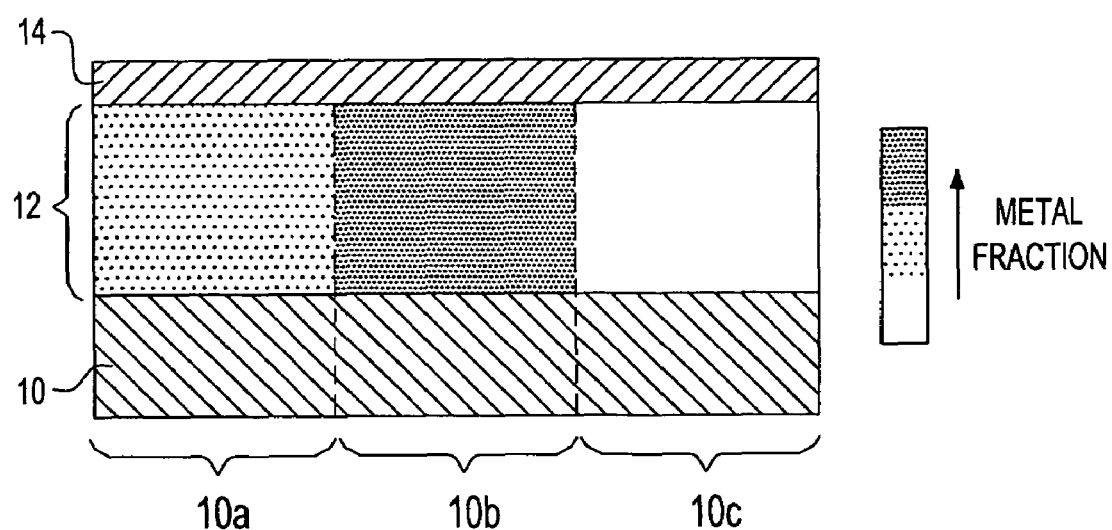
FIG. 2 shows a schematic cross-sectional diagram illustrating in grey-scale a metallization fraction within the circuit design of FIG. 1.

FIG. 2 depicts the circuit design of FIG. 1 in a comparative grey-scale representation with respect to metal fraction. Such a representation may in general be directed towards either an area fraction or a volume fraction, depending upon whether a thickness or depth of a pixel is initially considered. For the instant embodiment, an area fraction is preferred and a pixel thickness is entered into a calculation at a later interval to provide a volume fraction. As is seen from FIG. 1, pixel 10b has the highest metal fraction. Pixel 10a has an intermediate metal fraction. Pixel 10c has the lowest metal fraction. Thus, in accordance with the metal fraction legend that accompanies FIG. 2, pixel 10b is assigned black on the grey-scale, pixel 10c is assigned white on the grey-scale and pixel 10a is assigned grey on the grey-scale. Although FIG. 2 illustrates grey-scale with respect to a cross-section of a pixel element, in accordance with further disclosure below the embodiment and the invention typically and preferably also contemplate that a grey-scale may also be designated within the context of plan-view pixels rather than cross-section pixels.

The instant embodiment and the invention are directed towards analysis of a circuit design similar to that illustrated in FIG. 1, within the context of dimensional and mechanical parameters. The analysis is undertaken within the context of the process steps outlined within the schematic flow diagram of FIG. 3.

The invention comprises a computer assisted invention. Accordingly, the invention can take the form of an entirely hardware embodiment, an entirely software embodiment or an embodiment containing both hardware and software elements. In the instant embodiment, the invention is implemented in software, which includes but is not limited to: firmware, resident software, microcode, etc.

Furthermore, the invention can take the form of a computer program product accessible from a computer-usable or computer-readable medium providing program code for use by or in connection with a computer or any instruction executing system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared or semiconductor system (or apparatus or device) or a propagation medium. Examples of computer readable medium include a semiconductor or solid state memory, magnetic tape, a removable computer diskette, a random access memory (RAM), a read only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 3:
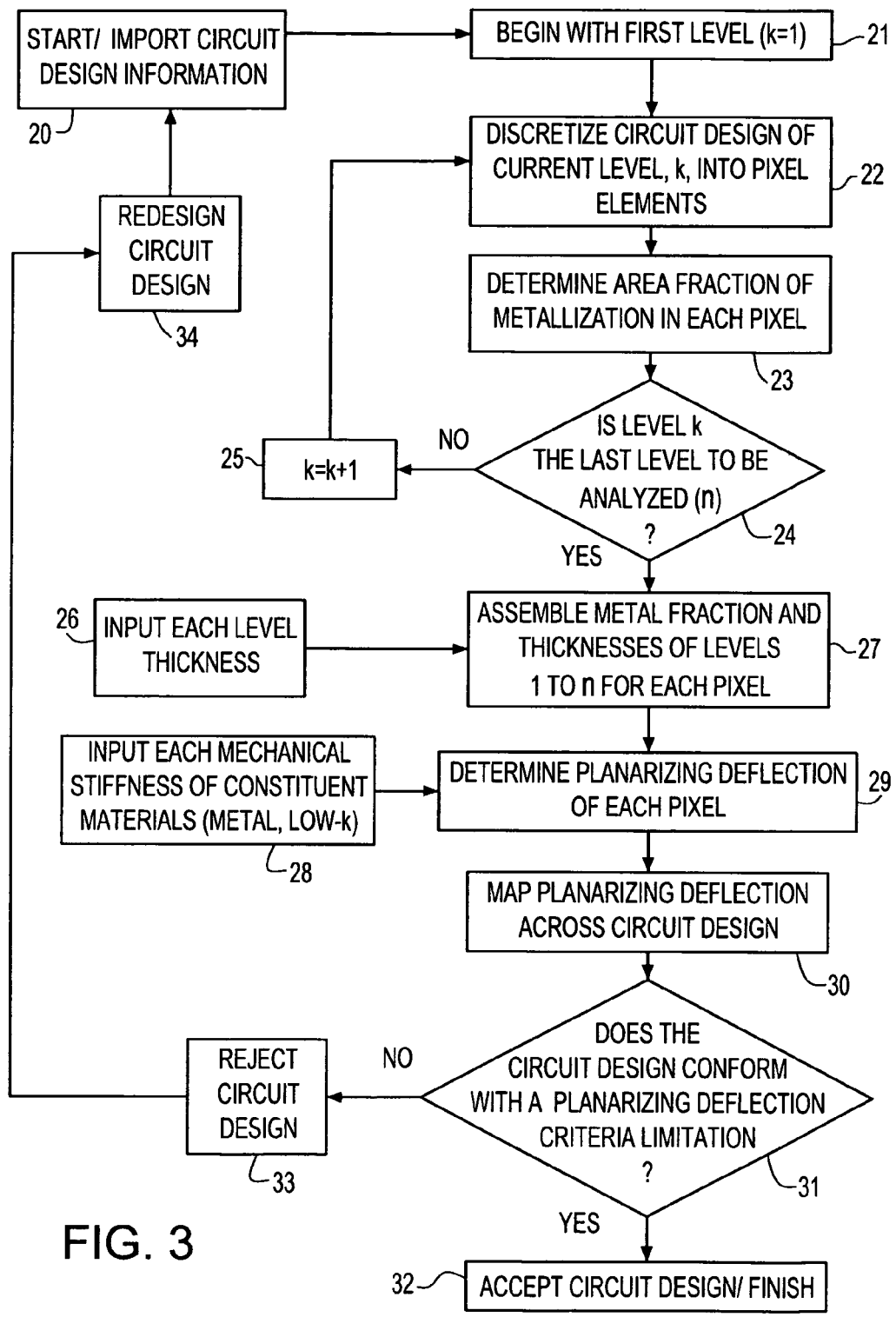
FIG. 3 shows a flow chart illustrating a series of process steps in accordance with the invention.

The schematic block diagram of FIG. 3 depicts computer assisted process steps comprising the instant embodiment of the invention. In accordance with reference numeral 20, practice of the instant embodiment starts with importing circuit design information for further processing in accordance with the instant embodiment. Circuit design files for semiconductor (i.e., chip) circuit designs are typically designated as GL1 files or GDS files (either are specific files that result from proprietary or commercially available design software; IBM Corporation, Armonk, N.Y. (GL1 files) and Cadence Design Systems, Inc., San Jose, Calif. (GDS files) are typical by not limiting circuit design software suppliers). Circuit design files of other formats may be utilized provided that sufficient three-dimensional circuit information is provided. Similarly, scanned files from actual drawings, digital images or scanned photographs may also be utilized, again, provided that sufficient three-dimensional circuit information is provided. The instant embodiment assumes at minimum that the circuit design files include level-by-level dimensional and materials composition information for a circuit design analyzed in accordance with the instant embodiment.

In accordance with reference numeral 21, analysis of a specific circuit design begins with a first level (i.e., counter k=1) of the circuit design. In accordance with disclosure above, it is common within semiconductor circuit design to have at least 10-12 metallization levels within a back end of line (BEOL) circuit design. However, neither the instant embodiment nor the invention in general is limited to semiconductor circuit design, nor a circuit design having 10-12 metallization levels.

In accordance with reference numeral 22, the first level of the circuit design is discretized into a series of pixels. The pixels are typically intended as plan-view pixels and have dimensions in area appropriate to the type of circuit design from which they are discretized. The circuit design is also appropriately discretized within the context of hardware and software components available and utilized within the embodiment and the invention. Typically, the circuit design is discretized into a rectangular array of pixels. Each pixel represents a subsection of the circuit design. The area of each pixel may be uniform or alternatively it may be adaptively sized to uniquely match features within the circuit design. For a semiconductor circuit design, pixel dimensions from about 10 nm to about 1000 nm are typical and desirable. For other circuit designs, larger dimensions may be appropriate.

In accordance with reference numeral 23, a fraction of metallization in each pixel is determined. The instant embodiment provides that the fraction is an area fraction, although some embodiments of the invention may also provide value within the context of an immediate determination of a volume fraction of metallization. In a more general sense, the invention contemplates determining a fraction of at least one constituent material within each pixel element. Alternative embodiments of the invention may provide for determining fractions (either area or volume) of all constituent materials within a series of pixels within a particular layer within a circuit design. The metallization fraction determination may utilize specific software components, such as but not limited to NIAGARA™ software (available from IBM Corporation, Armonk, N.Y.), but the invention is not so limited. Alternative graphical analysis software programs may also be utilized.

In accordance with reference numerals 24 and 25, an inquiry is made whether the level of circuit design that has been discretized is the last level to be analyzed within the circuit design. As noted above, the last level to be analyzed within the circuit design need not necessarily be the last level within the circuit design since the invention contemplates that the invention is applicable for partially completed circuit design structures (i.e., incomplete circuit designs). If the last level of the circuit design has not been discretized, a counter (i.e., k) is incremented and the process steps corresponding with reference numerals 22 and 23 are repeated until the last level to be analyzed within the circuit design is discretized and its metallization fraction determined. If the last level to be analyzed within the circuit design has been discretized, the instant embodiment proceeds to the instructions associated with reference numerals 26 and 27.

In accordance with reference numerals 26 and 27, metal fractions and level thickness are assembled for each pixel within each level within the discretized circuit design. The process steps encompassed by reference numeral 26 and 27 may be effected while utilizing computer hardware and software as described above. Typically, the data as categorized above is assembled into an appropriate database. Either commercially available database software or proprietary database software may be utilized.

In accordance with reference numeral 28, mechanical stiffness (i.e., Young's modulus) of constituent materials within a circuit design is also provided. The embodiment and invention preferably include mechanical stiffness of all constituent materials within a circuit design, but the embodiment and invention are still operable, but perhaps less accurate, when constituent materials of minor area or volume fraction are excluded.

In accordance with reference numeral 29, the instant embodiment provides for determining a planarizing deflection for each pixel. Particular algorithms that may be utilized to realize that determination are disclosed in further detail below.

In accordance with reference numeral 30, a variation in planarizing deflection is mapped across the circuit design. Within the instant embodiment, the mapping is preferably intended to encompass the complete circuit design, but in accordance with disclosure above the invention is not so limited. Rather alternate embodiments may also contemplate that a mapping may map only certain horizontal or vertical sub-portions of a circuit design. The instant embodiment preferably maps all levels of a circuit design into a two dimensional map presentation. The two dimensional map may utilize a grey-scale or a color-scale indicative of increments of planarizing deflection. The grey-scale or the color-scale provides three dimensional information to the two dimensional map. Any of several software products may be used for mapping as described above. The software packages may be commercially available, as well as proprietary.

In accordance with reference numeral 31, once a map of pixel based planarizing deflection is drawn, the embodiment provides for additional analysis of the circuit design predicated upon the map (i.e., within the context of the invention as claimed this comprises evaluating the map). In particular, the embodiment provides for determining whether a particular circuit design having a particular extent of fabrication conforms with a particular deflection criteria limitation within a planarizing deflection map (i.e., a topographic map).

In accordance with reference numeral 32, if the circuit design conforms with a particular deflection limitation, the circuit design is accepted and the algorithm as illustrated in FIG. 3 is finished (i.e., ended).

In accordance with reference numeral 33, if a circuit design does not conform with a particular deflection limitation, the circuit design is rejected, and further in accordance with reference numeral 34 the circuit design is redesigned. With respect to rejection, for example and without limitation, under such circumstances an analysis of the planarizing deflection map may yield a determination that certain area portions of a circuit design have a planarizing deflection inconsistent with a depth of focus of a photolithographic method intended for photoexposing a photoresist layer intended to be located upon those certain area portions of the circuit design. Under those circumstances the circuit design may be rejected as inconsistent with available manufacturing capabilities. Such a redesign may provide a circuit design that might be altered in order to conform with available manufacturing capabilities.

Determining the planarizing deflection for each pixel in accordance with reference numeral 29 involves a mechanical modeling of the circuit design for each pixel. It includes an analysis of all of the wiring levels under consideration (which may be less than the total number of wiring levels within the circuit design), as well as the constituent materials in each level. The total planarizing deflection within a pixel is a summation of the deflections at each level, which is a function of the level thickness, h, the area fraction, $x_j$, of the constituent materials and the stiffness or Young's modulus, $E_j$, of the constituent materials. The magnitude of the deflection is also affected by the downforce, P, applied during planarizing.

Planarizing may include, but is not limited to: mechanical planarizing or chemical mechanical polish (CMP) planarizing. A general equation (i.e., algorithm) that may be used to calculate a total deflection, δ, for a particular pixel is provided as follows:

$$\delta = \frac{P}{A} \sum_i \left[ \frac{h_i}{\sum_j x_j^i E_j^i} \right] \quad (1)$$

where: δ=deflection;
P=planarizing downforce;
A=pixel area;
$h_i$=height of the $i^{th}$ wiring level;
$x_j^i$=area fraction of the $j^{th}$ constituent material in the $i^{th}$ wiring level; and
$E_j^i$=Young's modulus of the $j^{th}$ constituent material in the $i^{th}$ wiring level.

In a simplified embodiment for illustrative purposes, two constituent materials only may be considered. Within the context of a semiconductor back end of line (BEOL) circuit design, they may comprise copper as a metallization constituent material and a low dielectric constant dielectric material as a dielectric constituent material. Under such circumstances, equation 1, above, may be simplified as follows:

$$\delta = \frac{P}{A} \sum_i \left[ \frac{h_i}{x_{Cu}^i E_{Cu} + (1 - x_{Cu}^i) E_{diel}} \right] \quad (2)$$

where: δ=deflection;
P=planarizing downforce;
A=pixel area;
$h_i$=height of the $i^{th}$ wiring level;
$x_{Cu}^i$=area fraction of copper constituent material in the $i^{th}$ wiring level;
$E_{Cu}$=Young's modulus of copper constituent material; and
$E_{diel}$=Young's modulus of the dielectric constituent material.

Figure 4:
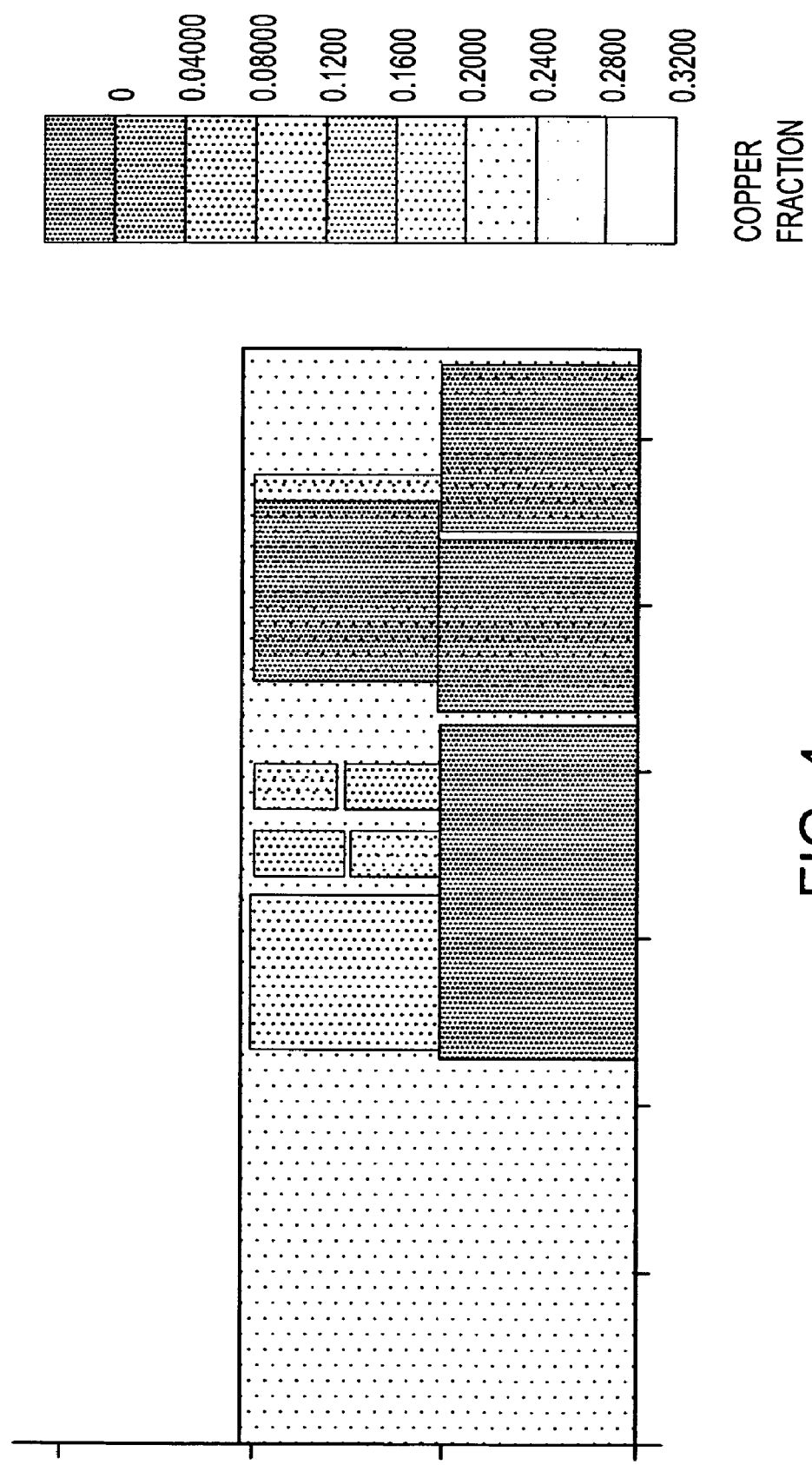
FIG. 4 shows a grey-scale map of discretized metal fraction within a circuit design.

To illustrate the instant embodiment, semiconductor circuit design information was discretized for a multilayer metallization semiconductor back end of line (BEOL) circuit design. The circuit design included three metallization levels, each having a thickness of about 1500 angstroms. The discretization considered a copper metal constituent material (Young's modulus of 130 GPa) and a low dielectric constant dielectric constituent material (Young's modulus of 15 GPa). A grey-scale map of copper metal fraction is illustrated in FIG. 4. Darker areas are low copper fraction areas and lighter areas are high copper fraction areas.

The discretized information in FIG. 4 was further analyzed for individual pixel planarizing deflection. The further analysis assumed a pixel area of 10000 square microns, and a planarizing downforce of 50 kilopascals. The analysis utilized equation 2, above.

Figure 5:
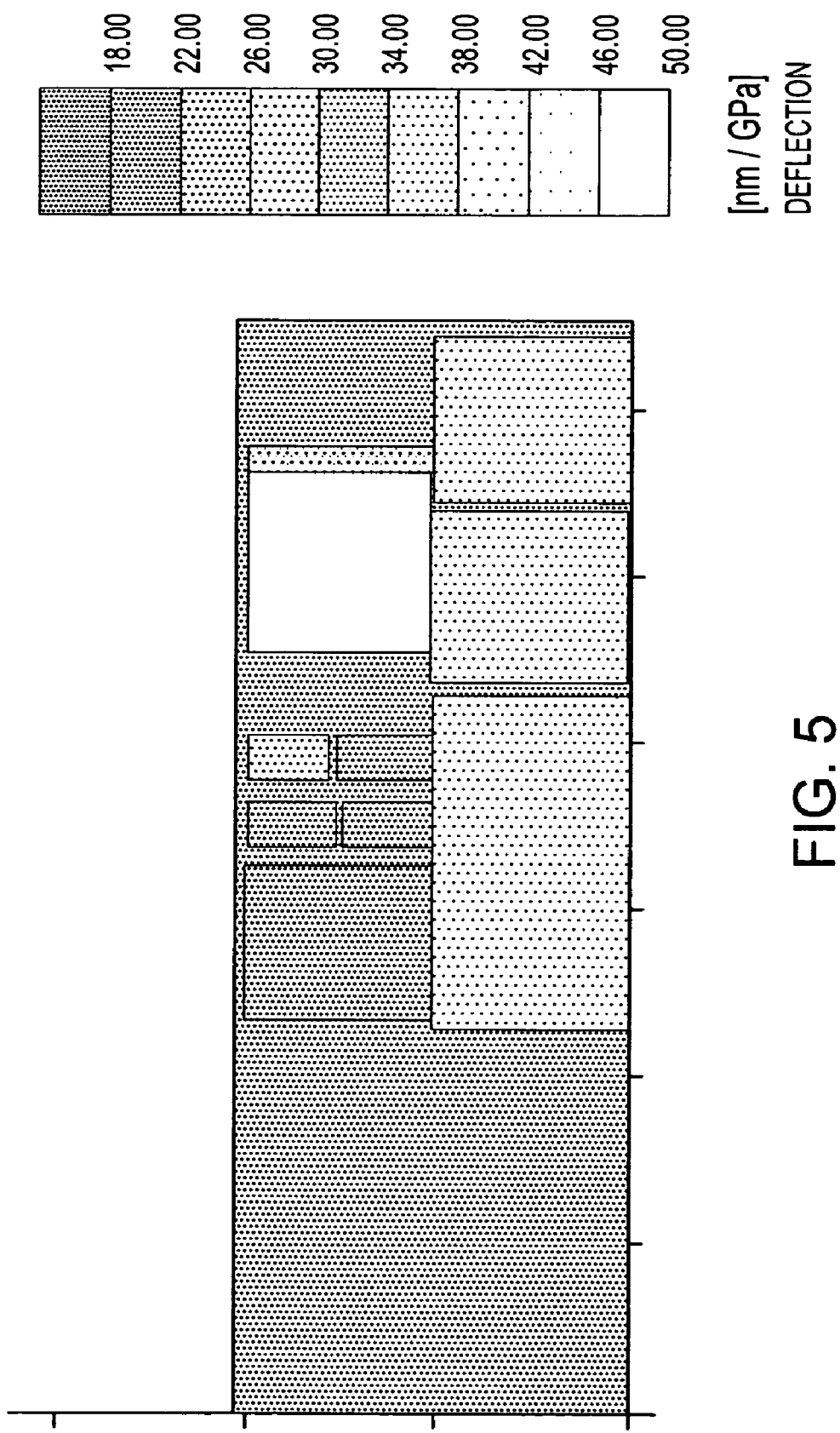
FIG. 5 shows a grey-scale map of discretized deflection corresponding with the grey-scale map of FIG. 4.

FIG. 5 shows a grey-scale diagram illustrating surface deflection in nm/GPa corresponding with the grey-scale diagram of FIG. 4. As expected, light areas and dark areas are generally inverted and complementary. Maximum deflections are seen in areas with highest dielectric layer fractions.

It should be apparent to those skilled in the art that given the teachings above, other embodiments of a system and a method in accordance with the invention may be made without departing from the spirit of the invention. For example, a BEOL architecture to be analyzed is not limited to a copper metallurgy embedded in low-k dielectric material but can be applied to any type of material system. Accordingly, such modifications are considered within the scope of the invention as limited by the appended claims.

In summary, the preferred embodiment of the invention is illustrative of the invention rather than limiting of the invention. Revisions and modifications may be made to methods, materials, structures and dimensions in accordance with the preferred embodiment of the invention while still providing an embodiment in accordance with the invention, further in accord with the accompanying claims.

What is claimed is:

1. A method for analyzing a circuit design comprising:
   discretizing a circuit design into a series of pixel elements comprising copper and a low dielectric constant dielectric material;
   determining for each pixel element a fraction of at least one constituent material; and
   determining for each pixel element a deflection predicated upon a planarizing of the pixel element while utilizing an algorithm that includes the fraction of the at least one constituent material, wherein the algorithm is:

$$\delta = \frac{P}{A} \sum_i \left[ \frac{h_i}{x_{Cu}^i E_{Cu} + (1 - x_{Cu}^i) E_{diel}} \right]$$

where: δ=deflection;
P=planarizing downforce;
A=pixel area;
$h_i$=height of the $i^{th}$ wiring level;
$x_{Cu}^i$=area fraction of copper in the $i^{th}$ wiring level;
$E_{Cu}$=Young's modulus of copper; and
$E_{diel}$=Young's modulus of dielectric.

2. The method of claim 1 further comprising mapping the deflection for each pixel element.

3. The method of claim 2 further comprising evaluating the map.

4. The method of claim 1 wherein the circuit design comprises a semiconductor circuit design.

5. The method of claim 1 wherein the circuit design is an incomplete circuit design.

6. A method for analyzing a circuit design comprising:
   discretizing a circuit design into a series of pixel elements;
   determining for each pixel element a fraction of at least one constituent material; and
   determining for each pixel element a deflection predicated upon a planarizing of the pixel element while utilizing an algorithm tat includes the fraction of the at least one constituent material, where the algorithm is:

$$\delta = \frac{P}{A} \sum_i \left[ \frac{h_i}{\sum_j x_j^i E_j^i} \right]$$

where: δ=deflection;
P=planarizing downforce;
A=pixel area;
$h_i$=height of the $i^{th}$ wiring level;
$x_j^i$=area fraction of the $j^{th}$ constituent material in the $i^{th}$ wiring level; and
$E_j^i$=Young's modulus of the $j^{th}$ constituent material in the $i^{th}$ wiring level.

7. The method of claim 6 further comprising mapping the deflection for each pixel element.

8. The method of claim 7 further comprising evaluating the map.

9. The method of claim 6 wherein the circuit design is an incomplete circuit design.

* * * * *